United States Patent [19]

Kaplow et al.

[11] 4,042,417
[45] Aug. 16, 1977

[54] PHOTOVOLTAIC SYSTEM INCLUDING A LENS STRUCTURE

[75] Inventors: Roy Kaplow, Newton; Robert I. Frank, Cambridge, both of Mass.

[73] Assignee: Massachusetts Institute of Technology, Cambridge, Mass.

[21] Appl. No.: 690,056

[22] Filed: May 26, 1976

[51] Int. Cl.² ............................................. H01L 31/06
[52] U.S. Cl. ............................. 136/89 PC; 136/89 SJ
[58] Field of Search ............... 136/89 P, 89 PC, 89 SJ

[56] References Cited

U.S. PATENT DOCUMENTS

| 3,018,313 | 1/1962 | Gattone | 136/89 |
| 3,999,283 | 12/1976 | Dean et al. | 29/572 |
| 4,002,031 | 1/1977 | Bell | 60/641 |

OTHER PUBLICATIONS

R. J. Soukop, "High-Voltage Vertical Multijunction Solar Cell," *J. Appl. Phys.*, vol. 47, No. 2, pp. 555–559 (1976), Feb.

B. L. Sater et al., "The Multiple Junction Edge Illuminated Solar Cell," *IEEE 10th Photovoltaic Specialists Conf. Record*, (Nov. 1973).

*Primary Examiner*—John H. Mack
*Assistant Examiner*—Aaron Weisstuch
*Attorney, Agent, or Firm*—Hopgood, Calimafde, Kalil, Blaustein & Lieberman

[57] ABSTRACT

A photovoltaic or solar cell generator includes a plurality of unit solar cells each having one or more p-n junctions. An optical light-focusing system, which includes an array of lens elements, focuses the incoming radiation into a series of preferably narrow beams that are incident on the surfaces of the unit solar cells at locations lying immediately adjacent but spaced from the p-n junctions.

10 Claims, 6 Drawing Figures

PHOTOVOLTAIC SYSTEM INCLUDING A LENS STRUCTURE

The present invention relates generally to solar energy conversion, and more particularly to a photovoltaic solar cell system employing an optical system for focusing incident radiation onto the solar cells in a manner to achieve increased electrical output and higher efficiency of operation.

The increasing interest in solar energy has been extensively directed toward the use of semiconductor solar cells for converting incident solar energy to electrical energy. In this effort, the design activities have been primarily directed toward increasing the electrical output of the cell and achieving higher efficiency of energy conversion so that generation of electrical energy by the use of solar cells, in terms of cost per kilowatt-hour of energy produced, may become comparable to conventional methods of generating electrical energy.

In a conventional solar cell, a p-n junction is formed parallel to the upper surface of the cell which receives the incident radiation, and a contact grid is formed on that upper surface. In these cells, current flows in the plane of a thin surface region from the contact grid to the base of the cell. In order to avoid series resistance effects, either a very fine grid geometry or a highly doped surface region must be provided in the cell. The conventional cell is thus inefficient at high concentrations of incident light so that it is not possible to significantly increase the output of the cell by increasing the intensity of the incident light on the cell beyond an intensity of about 50 –100 "suns".

A solar cell for use with high-intensity radiation having a vertical p-n junction has been disclosed in a NASA Technical Memorandum entitled "The High Intensity Solar Cell - Key to Low Cost Photovoltaic Power" by Bernard L. Sater and Chandra Goradia, presented at the 11 Photovoltaic Specialists Conference sponsored by the IEEE in may, 1975. Other solar cells having vertical p-n junctions are described in U.S. Pat. No. 3,690,953 to Wise; in an article entitled "High Voltage Vertical Multijunction Solar Cell" by E. J. Soukup, published in *Journal of Applied Physics, Vol.* 47, No. 2, February, 1976; and in an article entitled "Analysis of Vertical Multijunction Solar Cells Using a Distributed Circuit Model" by Pradeep Shah that appeared in *Solid-State Electronics*, 1975, Vol. 18, pp. 1099–1106.

Several approaches are possible in order to improve the efficiency of vertical-junction solar cells. One of these is the use of silicon having a very long minority carrier lifetime, and a second is the reduction of the width of the "dead" regions consisting of the p+, n+, and electrode regions by a substantial factor, of between about 5 and 10. Both of these design expediments would, however, increase the cost of the cell; the first because of the high initial material costs, and the second because of the marked increase in fabrication costs.

It has been suggested, as in the aforementioned article by Soukup, to focus the light incident on an array of vertical-junction solar cells to increase the efficiency of operation of a solar cell of the vertical junction type. However, the Soukup arrangement is not a practical structure and does not produce the efficiency claimed in the article. There has, accordingly, thus far been no practical design of an optical light-focusing system and solar cell arrangement which produces the desired efficiencies of operation.

It is, therefore, an object of the invention to provide a photovoltaic generator capable of operation at higher outputs and at higher efficiencies of solar energy conversion.

It is a further object of the invention to provide a solar cell and light-focusing arrangement, in which a higher output of electrical energy is achieved by focusing radiation onto a localized surface area of the solar cells.

To these ends, the photovoltaic system of the invention comprises an array of unit semiconductor solar cells and an optical system including a plurality of lens elements which focuses the incoming radiation into a plurality of preferably narrow beams which are caused to be incident on the surfaces of the solar cells at a location near the p-n junctions of each unit solar cell.

In one aspect of the invention, the central optical planes of the lens elements, or as designated in the specification and claims, the optical axes of the lens elements, are spaced from one another by a distance corresponding to the spacing between the junctions, and are slightly offset therefrom to provide the desired beam of radiation near the junctions. This arrangement has been demonstrated by the inventors to cause a significant improvement in the efficiency of the photovoltaic system which is believed to be a result of the following: (1) light which would otherwise fall on the "dead" regions (and contribute little or nothing to cell output) is now available for creating carriers which may be collected, and (2) light incident near the junction creates carriers that have a greater probability of being collected than those created by light that is incident further from the junction.

To the accomplishment of the above and to such further objects as may hereinafter appear, the present invention relates to a photovoltaic system substantially as defined in the appended claims, and as described in the following detailed specification of several embodiments thereof, as considered in conjunction with the accompanying drawings, in which:

Figure 1:
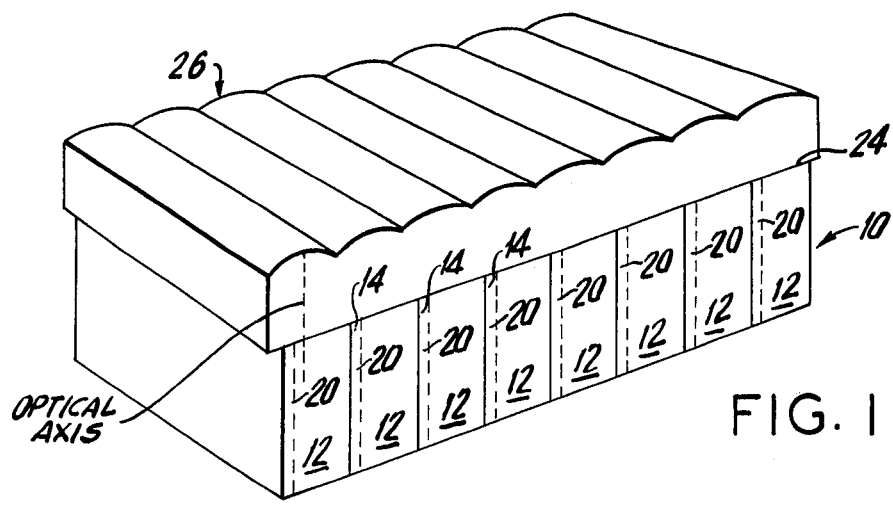
FIG. 1 is a perspective view of a solar cell arrangement according to one embodiment of the invention.

Turning now to the figures, there is shown in FIG. 1 a photovoltaic system according to one embodiment of the invention, which includes an array 10 formed of a plurality of solar cells 12 fabricated of a semiconductor material, which may be, but is not necessarily, silicon.

Figure 2:
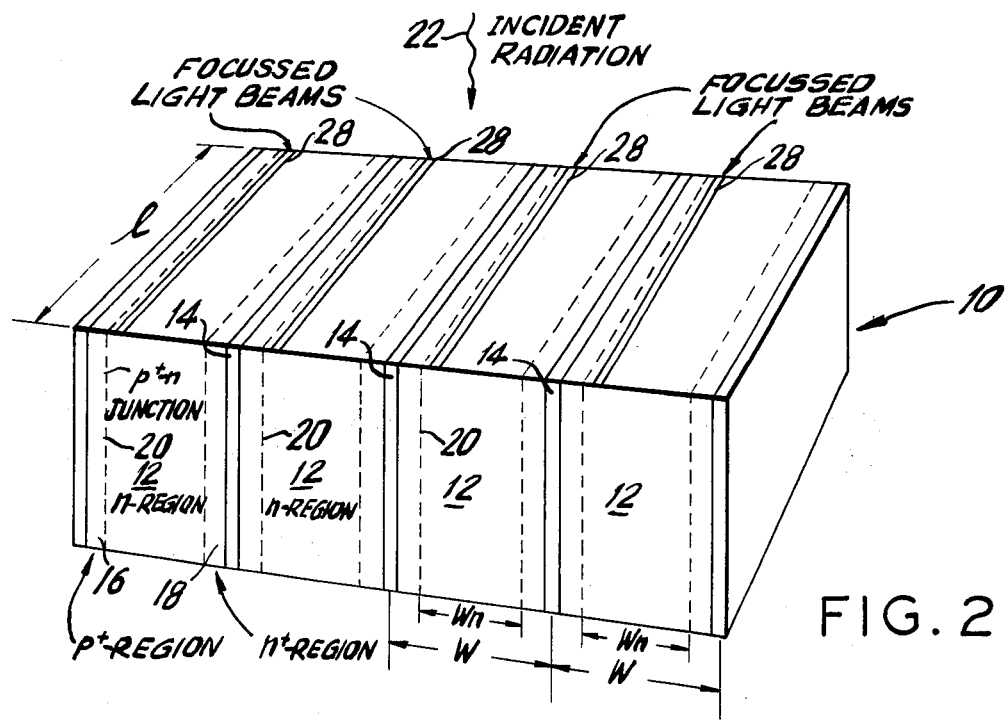
FIG. 2 is a perspective view, in greater detail than in FIG. 1, of the solar cell used in the arrangement of FIG. 1, illustrating the p-n regions of the cell near which the light beams are focused.

As shown in greater detail in FIG. 2, the solar cell array may comprise a plurality of slices of n-type silicon, which are separated by vertical conductive electrodes 14 made of any conducting material, such as aluminum, which forms an ohmic contact to the adjacent silicon regions. Each of the silicon slices has formed therein, such as by diffusion, a vertical p+ region 16 and an n+ region 18. A vertical p-n junction 20 is created at the interface of p+ region 16 and the n-type substrate which gives rise to the photovoltaic effect, as is known.

The p-n junctions of the plurality of the unit solar cells in the array of FIGS. 1 and 2 lie in planes that are parallel to one another and, as shown, may also for certain conditions of incident light, be parallel to the direction of incident radiation indicated at 22 in FIG. 2. The upper or light-receiving surface of the solar cell array may be coated with an anti-reflection coating 24 (not shown in FIG. 2).

In accordance with the invention, the incident light is focused by an optical lens structure 26 of FIG. 1 interposed between the incident light source and the light-receiving surface of the solar-cell array, into a series of narrow focused beams 28, which as seen best in FIG. 2, are incident immediately adjacent, but slightly spaced toward the n-type substrate material, from the planes of the p+−n junctions 20. A stated previously, the focusing of the incident radiation in this manner onto the surface of the unit solar cells has been found by the inventors to significantly increase the efficiency of conversion of incident light to electrical energy, resulting from the creation of carriers near the p+−n junctions which are collected by suitable, conventional means (not shown).

Figure 3:
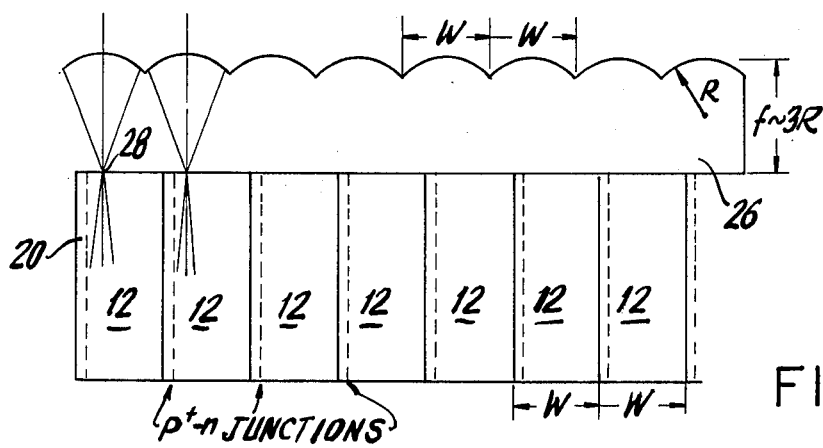
FIG. 3 is a schematic diagram of the solar cell arrangement of FIG. 1, illustrating the beam focusing pattern on the solar cell.

To this end, the optical lens structure 26 may, as shown in FIG. 1 and schematically in FIG. 3, be in the form of a series of miniature cylindrical lenses formed of a suitable transparent material, such as acrylic or polystyrene. As shown, lens structure 26 includes a planar surface that rests on, and is secured to, the upper light-receiving surface of the array of solar cells, such as by means of a transparent cement.

As shown in FIG. 3, the center-to-center spacing of each unit lens elements of lens structure 26 is equal to the width W of the unit solar cells 12. Moreover, the optical axes of the unit lens elements are parallel to, and slightly offset, from the planes of the p+−N junctions of the unit solar cells, and the top surface of the lens array is spaced from the cell surface by a distance substantially equal to the focal length of the individual lens elements such that, as stated previously, the incident light is focused into a plurality of narrow beams which are respectively incident on the solar cells along strips which are adjacent to, but spaced from the p+−n junctions, and on the substrate or n-type side of the junction.

The focal element of the individual lens elements of the lens structure 26, in the embodiment of FIGS. 1–3, is approximately equal to three times the radius of curvature R of those lens elements; that is, $f \sim 3R$. The choice of lens design depends on a number of factors, such as the angle of incidence of the incident radiation and the unit solar cell width, W. The minimum radius of curvature R of each of the lens elements in the embodiment of FIGS. 1–3, is $R = W/2$. However, in order to avoid large angle of incidence effects at the edge of the lens, it is desirable to make $R_{min} \leq W/\sqrt{2}$, which gives a maximum angle of incidence $\theta$ max, for parallel incident radiation on the lens (FIG. 4) of 45°.

Figure 4:
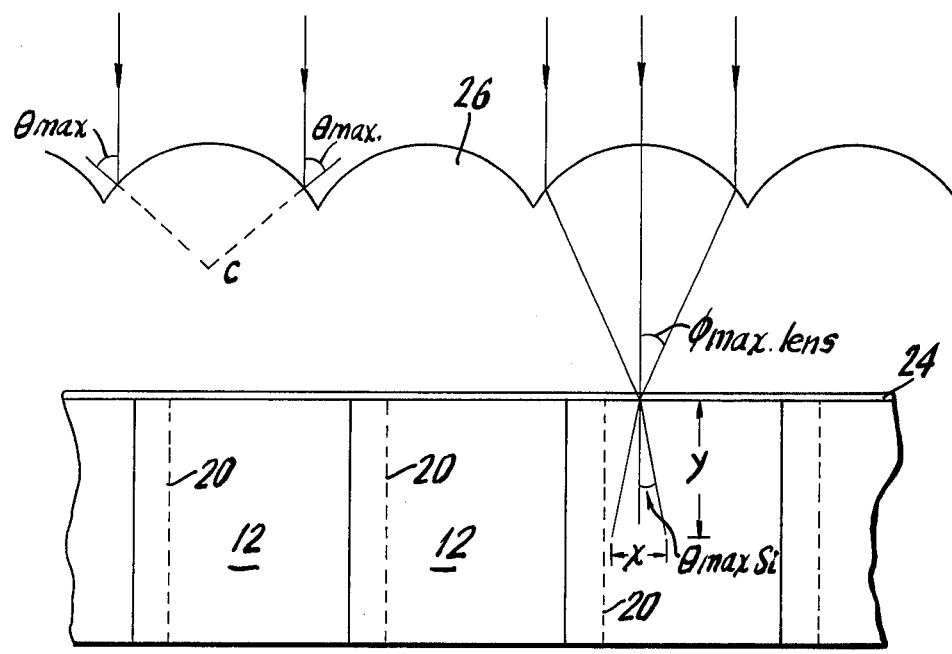
FIG. 4 is a detail of the schematic illustration of FIG. 3, showing beam divergence within the solar cell.

The focused narrow beam, as indicated in FIG. 4, diverges in the interior of the solar cell. The width of the beam within the cell depends on the lens design and on the direction of the incident light. For parallel to the junction, and assuming no lens aberrations, and neglecting dispersion, the image at the focal "plane" of each lens is a straight line of infinitesimal width. The light entering the cell forms a beam diverging from this line with a half-angle depending on the maximum angle of incidence of light on the cell and on the indices of refraction of the lens material and cell material. For the plano-convex non-emerging lens design of FIGS. 1–3, the maximum angle of incidence in the cell, $\phi_{max}$, is given approximately by tan $\phi_{max} = (W/2)f$ (see FIGS. 3 and 4). Since $n_{lens}$ sin $\phi_{lens} = n_{si}*$ sin $\phi_{si}$, and $n_{lens} \sim 1.5$, $n_{si} \simeq 3.5$, then sin $\phi_{si} = (1.5/3.5)$ (sin $\phi_{lens}$), or for the maximum angle, sin $\phi_{si\ max} = (1.5/3.5)$ sin $\phi_{max\ lens}$ = 1.5/3.5 sin tan $^{-1}(W/2f)$. For typical values of W $\simeq$ 0.01 inches and $f = 3 (W/\sqrt{2}) = 0.021$ inches, $\phi_{si\ max}$ is equal to 5.7°.

*n is the index of refraction.

Thus, the beam spreads within the cell with an angle of 5.7° on either side of the lens optical axis. Since the lateral spread x, is given by $x = 2y$ tan (5.7°), where y is the distance into the cell from the surface, (see FIG. 4) $x = 0.2y$. For light absorbed 0.001 inches (1 mil) from the surface, $x = 0.2$ mil; for $y = 5$ mils, $x = 1$ mil. Since about 80 per cent of the incident sunlight is absorbed within 1 mil of the surface of the cell, the effective beam width is about 0.2 mil. The general, for a given unit cell width W, a shorter focal length gives a greater beam divergence.

Neglecting lens aberrations and dispersion, the beam width for this lens design at the focal point is given by the equation $x = 2(2R\theta)$ where R is the radius of curvature of the lens and $\theta$ is the maximum angle in radians of the incident light with respect to the normal to the cell surface. For sunlight incident at the earth's surface, $\phi\theta \simeq = 0.005$ radians. For the plano-convex lens design of FIGS. 1–3, $2R = 0.014$ using the same values of W and R as above. Thus, $x = 2 (0.014) (0.005) = 0.00014$ inches $\sim 0.1$ mil. The beam entering the cell in this case diverges from a line of width equal to 0.1 mils instead of from a line of negligible width as in the case of perfectly parallel light. However, the angle $\phi_{max}$ which determines the divergence remains essentially the same, so that the effective beam width in the cell may be considered to be the sum of the beam width at the cell surface plus the divergence, or 0.1 + 0.2 mils, giving a total effective beam width of 0.3 mils. For non-parallel incident light, as will occur in the high-intensity concentration system disclosed in our copending application Ser. No. 690,893 filed on even date herewith, the angle $\theta$ will typically range up to 10°, so that the beam width at 28 will range up to about 5.7 mils, assuming the above values for W and R.

Figure 5:
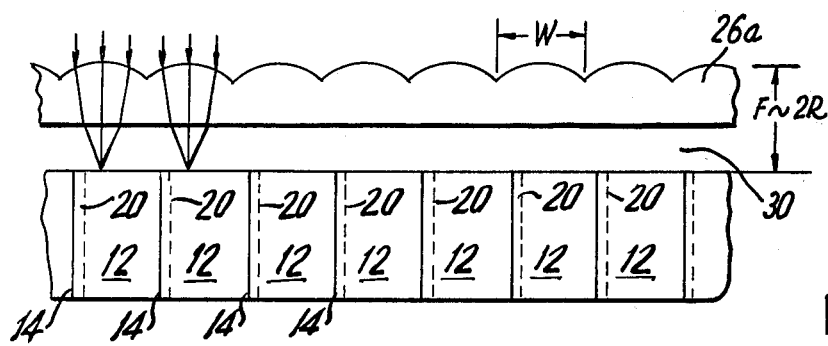
FIG. 5 is a schematic diagram of a solar cell arrangement according to an alternative embodiment of the invention.

In FIG. 5, the lens structure 26a is in the form of a plano-convex element having a lower planar surface that is spaced from the upper surface of the solar cell array by an air gap 30. In this embodiment, the focused beam emerges from the lens structure prior to being incident on the solar cells. The focal length of the lens elements is equal to twice the radius of curvature R; that is, $f \sim 2R$, assuming the the thickness of the lens array is small compared to R so that the thin less formula applies.

Figure 6:
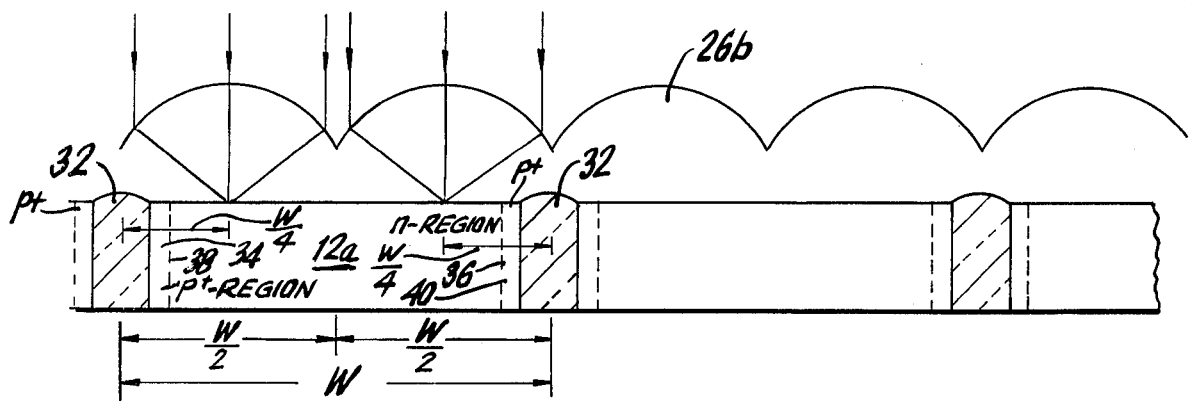
FIG. 6 is a schematic diagram of a solar cell arrangement according to yet another embodiment of the invention.

The lens structure of the invention, according to the embodiment illustrated in FIG. 6, like the previously described embodiments may be employed to advantage with a vertical junction solar cell of the type described in our co-pending application Ser. No. 689,989 filed on even date herewith. In this type of solar cell array, a plurality of unit solar cells 12a are formed on a single wafer of semiconductor material, such as, as shown in FIG. 6, of n-type silicon. The unit solar cells are separated by parallel, longitudinal (as viewed in plan) gaps that may be filled with an insulating material 32. Deep vertical regions 34 and 36 of p+-type conductivity are formed, as by diffusion into the substrate at each end of the unit solar cells, thereby forming two vertical p+-n junctions 38 and 40 along the sides of each solar cell.

In the embodiment of FIG. 6, the lens structure 26b is effective to focus the incoming parallel radiation into two narrow beams that are respectively incident on the substrate of each unit solar cell in the space between and adjacent the respective p-n junctions. The spacing of axes of the lens elements is one-half the unit cell width W, and the optical axis of each lens elements is at a distance of W/4 from the center of the gap.

The radius of curvature R of the lens elements is one-half that of a lens having a width of W as in the first-described embodiment, such that the beam widths for concentrated light produced by the lens structure of FIG. 6 will be one-half as wide as that achieved in the lens structure of the first embodiment.

Tests performed on a photovoltaic system as described in connection with FIGS. 1 to 3, but not optimized with respect to lens thickness, have demonstrated significant improvements in the efficiency of light-energy conversion, in the range of 50 to 60 percent. The lens structure may be made of an acrylic by pressure molding or casting or injection molding techniques and thus does not add much to the cost of the system.

Although the photovoltaic system of the invention has been herein specifically described with an n-type silicon substrate forming a junction with a p+ diffused region, other types of semiconductor material may also be employed to p-type as well as n-type conductivity, in which case the diffused region would be of n+-or n-type as well as p+-type conductivity.

It will be appreciated that modifications may be made in the embodiments of the invention hereinabove specifically described without necessarily departing from the spirit and scope of the invention.

What is claimed is:

1. Photovoltaic means for producing an electrical output from incident solar radiation, said photovoltaic means comprising a plurality of unit semiconductor solar cells each having at least one p-n junction, said p-n junctions being arranged in planes lying substantially parallel to the direction of the incoming radiation on the light-receiving surfaces of said cells, and optical radiation-focussing means comprising a corresponding plurality of optical elements having their optical axes arranged in spaced parallel relation in planes parallel to the planes of said p-n junctions, said optical axes being spaced by a distance substantially equal to $n$ times half of the width of each of said unit solar cells, where $n$ is an integer of one or two, each of said optical axes being respectively offset with respect to the planes of said p-n junctions, said radiation-focussing means thereby being effective to focus incident radiation onto said light-receiving surfaces as spaced narrow beams which are parallel to, and in primary adjacency to but offset from the planes of each of said p-n junctions, whereby radiation incident upon said light-receiving surface is directed essentially in the vicinity of each of said p-n junctions.

2. Photovoltaic means according to claim 1, in which the optical axes of said optical elements are spaced from one another by a distance substantially equal to the width of said unit solar cells.

3. Photovoltaic means according to claim 2, in which the radius of curvature of said optical elements is equal to or less than $W/\sqrt{2}$, where W is the width of each of said unit solar cells.

4. Photovoltaic means according to claim 2, in which the radius of curvature of said optical elements is at least equal to W/2, where W is the width of each of said unit solar cells.

5. Photovoltaic means according to claim 1, in which said optical radiation-focusing means is spaced from said solar cells by an air gap.

6. Photovoltaic means according to claim 3, in which the focal length of said optical elements is about twice the radius or curvature of said optical elements.

7. Photovoltaic means according to claim 1, in which said radiation-focusing means includes an array of plano-convex lenses having a planar surface secured to said light-receiving surface of said unit solar cells.

8. Photovoltaic means according to claim 6, in which the focal length of said optical elements is about 3 times the radius of curvature R of said optical elements.

9. Photovoltaic means according to claim 1, in which said narrow beams are focused at a distance of between 0 and 2.0 mils from said p-n junctions on the substrate side of said junctions.

10. Photovoltaic means for producing an electrical output from incident solar radiation, said photovoltaic means comprising a plurality of unit semiconductor solar cells each having at least one p-n junction, and optical radiation-focusing means comprising a corresponding plurality of optical elements having their optical axes arranged in spaced parallel relation, said radiation-focusing means being effective to focus incident radiation onto said light-receiving surfaces as spaced narrow beams which are parallel to, and in offset adjacency to, said p-n junctions, whereby radiation incident upon said light-receiving surface is directed essentially in the vicinity of but offset from each of said p-n junctions.

* * * * *

Notice of Adverse Decision in Interference

In Interference No. 100,136, involving Patent No. 4,042,417, R. Kaplow and R. I. Frank, PHOTOVOLTAIC SYSTEM INCLUDING A LENS STRUCTURE, final judgment adverse to the patentees was rendered Apr. 14, 1980, as to claims 1, 2, 5 and 7.

[*Official Gazette July 22, 1980.*]